United States Patent
Goldfarb et al.

(10) Patent No.: US 7,170,332 B2
(45) Date of Patent: Jan. 30, 2007

(54) REFERENCE SIGNAL GENERATORS

(75) Inventors: Marc E. Goldfarb, Atkinson, NH (US); Edmund J. Balboni, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/825,891

(22) Filed: Apr. 15, 2004

(65) Prior Publication Data

US 2005/0231240 A1   Oct. 20, 2005

(51) Int. Cl.
*G06F 1/04* (2006.01)

(52) U.S. Cl. ..................... 327/291; 327/295

(58) Field of Classification Search .......... 327/3, 327/105, 149, 158, 271, 272, 273, 278, 291, 327/292, 293, 294, 297, 298, 299; 331/57, 331/109, 117, 175, 182, 186

See application file for complete search history.

(56) References Cited

U.S. PATENT DOCUMENTS

| | | | | |
|---|---|---|---|---|
| 4,360,789 | A |  | 11/1982 | Lewyn et al. ............... 331/109 |
| 4,833,427 | A |  | 5/1989 | Leuthold et al. ............ 331/165 |
| 4,999,588 | A |  | 3/1991 | Koch ......................... 331/109 |
| 5,034,706 | A |  | 7/1991 | Betti et al. .................. 331/117 |
| 6,064,277 | A |  | 5/2000 | Gilbert ....................... 331/117 |
| 6,091,307 | A |  | 7/2000 | Nelson ....................... 331/109 |
| 6,278,338 | B1 |  | 8/2001 | Jansson ....................... 331/116 |
| 6,404,258 | B2 | * | 6/2002 | Ooishi ........................ 327/278 |
| 6,492,852 | B2 | * | 12/2002 | Fiscus ........................ 327/158 |
| 6,556,935 | B2 | * | 4/2003 | Morimura et al. .......... 702/104 |
| 6,642,746 | B2 | * | 11/2003 | Donnelly et al. ............... 327/3 |
| 6,917,229 | B2 | * | 7/2005 | Cho ............................ 327/158 |
| 2001/0020876 | A1 |  | 9/2001 | Tsukagoshi et al. ......... 331/158 |
| 2005/0046495 | A1 | * | 3/2005 | Li ................................ 331/57 |
| 2005/0093638 | A1 | * | 5/2005 | Lin et al. .................... 331/176 |

FOREIGN PATENT DOCUMENTS

EP   1143606   10/2001

OTHER PUBLICATIONS

Harvey, Barry, "High-Purity Sinewave Oscillators with Amplitude Stabilization", Elantec High Performance Analog Integrated Circuits, Application Note 5, pp. 1-4.

(Continued)

*Primary Examiner*—Linh My Nguyen
(74) *Attorney, Agent, or Firm*—Koppel, Patrick & Heybl

(57) ABSTRACT

Reference signal generators are provided that automatically adjusts a reference signal's amplitude when that signal is delivered into system loads having unknown capacitances. The amplitude is preferably initiated at a maximum amplitude to insure operation of system elements that require the reference signal. It is subsequently adjusted downward to a controlled reference amplitude which is predetermined to be an amplitude sufficient to sustain proper operation of the system elements but sufficiently reduced to minimize the spurious signals typically generated by fast high-level current transitions. In addition, the reduction to the controlled amplitude reduces the system current drain. The level control is realized in a buffer amplifier so that the amplitude level of an oscillator signal can be set independently to maximize its signal-to-noise performance. Accordingly, requirements for the reference amplitude do not compromise requirements for the amplitude level of the oscillator signal.

27 Claims, 9 Drawing Sheets

OTHER PUBLICATIONS

Shin, Hyunchol, et al., "Intermediate-Frequency/Baseband Analog Processing Chipset for a CDMA/AMPS Mobile Handset", Journal of the Korean Physical Society, vol. 39, No. 1, Jul. 2001, pp. 160-164.

Vittoz, Eric, et al., "CMOS Analog Integrated Circuits Based on Weak Inverfsion Operation", IEEE Journal of Solid-State Circuits, vol. SC-12, No. 3, Jun. 1977, pp. 224-231.

* cited by examiner

REFERENCE SIGNAL GENERATORS

BACKGROUND OF THE INVENTION

1. Field of the invention

The present invention relates generally to reference signal generators.

2. Description of the Related Art

Modern wireless communication systems are used throughout the world and operate over a variety of frequency bands. For example, the global system for mobiles (GSM) has now been accepted in over 140 countries. This system includes the E-GSM 880–915 and 925–960 MHz transmitting and receiving bands for mobiles, 1710–1785 and 1805–1880 MHz transmitting and receiving bands for digital communications services (DCS), and 1850–1910 and 1930–1990 MHz transmitting and receiving bands for United States Personal Communications Services (PCS).

Components of these wireless systems (e.g., cellular telephones) require reference signal generators that can provide demanding technical performance (e.g., high stability, linear response to a tuning potential, low phase noise and controlled signal levels that enhance system operations yet minimize spurious signal generation and system current drain) while being restricted to occupy a small portion of a communication integrated circuit and being available for extremely low cost (e.g., less than one dollar). Although conventional reference signal generators have met the needs of previous wireless systems, they have generally failed to meet these more demanding requirements.

BRIEF SUMMARY OF THE INVENTION

The present invention is directed to reference oscillator structures that automatically adjust a reference signal's amplitude at system loads of unknown capacitances while independently maintaining an oscillator amplitude that enhances its signal-to-noise performance. Requirements for the reference amplitude, therefore, do not compromise requirements for the amplitude level of the oscillator signal.

The novel features of the invention are set forth with particularity in the appended claims. The invention will be best understood from the following description when read in conjunction with the accompanying drawings.

DETAILED DESCRIPTION OF THE INVENTION

Reference signal generator embodiments are presented below which are particularly useful in a variety of wireless communication systems (e.g., cellular telephones) because they automatically adjust a reference signal's amplitude when that signal is delivered into system loads having various (and generally unknown) capacitances.

The amplitude is preferably adjusted downward from an initial maximum to a controlled amplitude that is sufficient for successful operation of the system elements that present the system loads. This downward adjustment insures that their operation is maintained throughout the amplitude leveling process. Spurious signal generation is thus inhibited, current drain is reduced, and the amplitude level of a crystal oscillator in the reference signal generator can be set independently to maximize its signal-to-noise performance.

These reference signal generator embodiments are shown in FIGS. 8–10B and their description is facilitated by preceding it with the following description of FIGS. 1–7 which show a wireless radio, a synthesizer in the radio and a crystal oscillator in the synthesizer.

Figure 1:
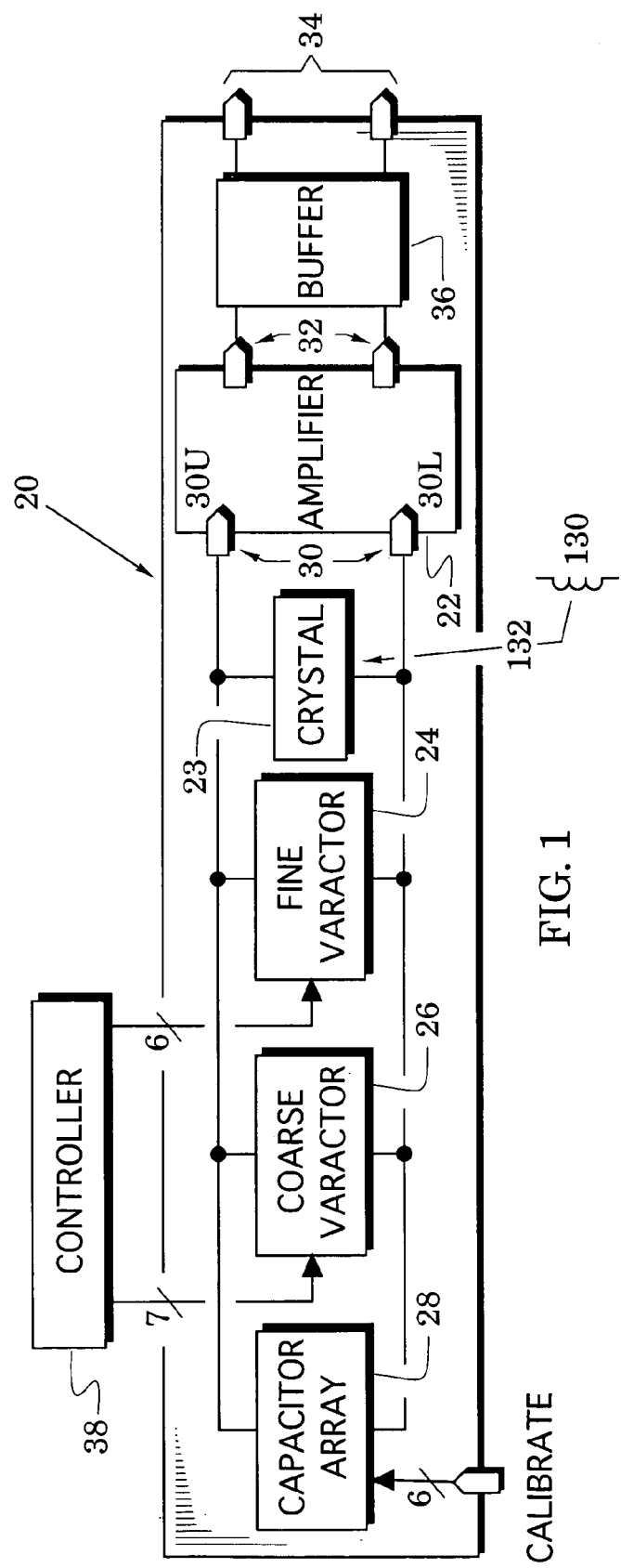
FIG. 1 is a block diagram of a crystal oscillator embodiment of the present invention.

In particular, FIG. 1 illustrates a reference oscillator 20 that includes an amplifier 22, a crystal 23, a fine varactor 24, a coarse varactor 26 and a selectable capacitor array 28. The crystal, the fine and coarse varactors and the capacitor array are coupled across an input port 30 (formed by upper and lower input terminals 30U and 30L) of the amplifier 22 and an output port 32 of the amplifier is preferably coupled to an oscillator output port 34 by a buffer 36 which helps to isolate the amplifier from variable load conditions. In an embodiment of the oscillator 20, the fine and coarse varactors are controlled by 6-bit and 7-bit signals from a controller 38 and the capacitor array is controlled by a respective 6-bit calibrate control signal.

In general, the amplifier 22 can be any of various circuits that are configured to define a negative-impedance at its input port 30 while delivering its output signal at its output port 32. Therefore, the amplifier is configured to feedback a portion of its output signal to its input port to maintain the oscillation condition and, accordingly, may be considered to be a maintaining amplifier.

Figure 2:
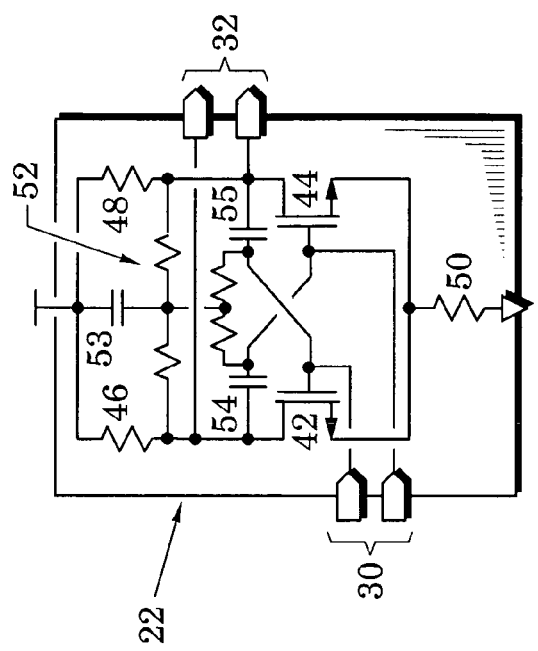
FIG. 2 is a schematic of an amplifier in the oscillator of FIG. 1.

An embodiment of the amplifier 22 is shown in FIG. 2 which illustrates a differential pair of first and second amplifier transistors 42 and 44 that each have a gate, a source and a drain. The transistor drains define the output port 32, the transistor gates define the input port 30 and the gates are cross coupled to the drains to provide the feedback that generates the negative impedance at the input port.

Drain resistors 46 and 48 couple the transistor drains to a bias voltage $V_{dd}$ and a resistor 50 is coupled to the transistor sources to form the "tail" of the differential pair. A balanced network 52 of resistors is coupled between the transistor gates and sources to set the biasing of the amplifier and an associated capacitor 53 bypasses common-mode signals to the bias rail to thereby maintain the balance. Finally, first and second capacitors 54 and 55 isolate the drain and gate biases.

In an important feature of the invention, the amplifier 22 is resistively biased to thereby enhance its reduction of phase noise in the output signal. Although not shown in FIG. 2, the drain and tail resistors (46, 48 and 50) are preferably adjustable (e.g., with transistor switches) so that the tail current can be adjusted over a current range (e.g., 200 to 1200 microamperes). When the oscillator signal is required, the tail current can be increased to reduce phase noise. When the oscillator signal is not required (e.g., during idle times of a cellular telephone that includes the reference oscillator), the tail current can be reduced to limit power usage and dissipation. In applications that are less concerned with phase noise, other oscillator embodiments may replace the drain and tail resistors with current sources.

Figure 3B:
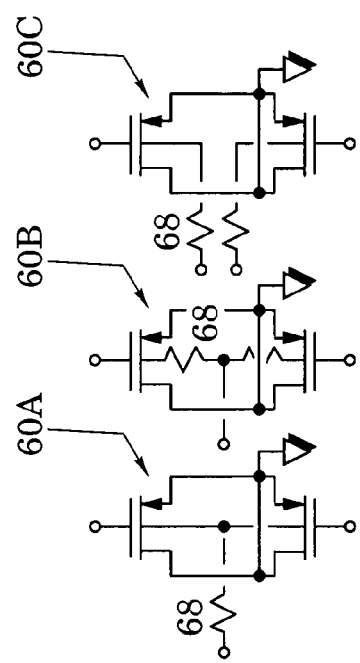
FIGS. 3A and 3B are schematics of a fine varactor in the oscillator of FIG. 1.
Figure 3A:
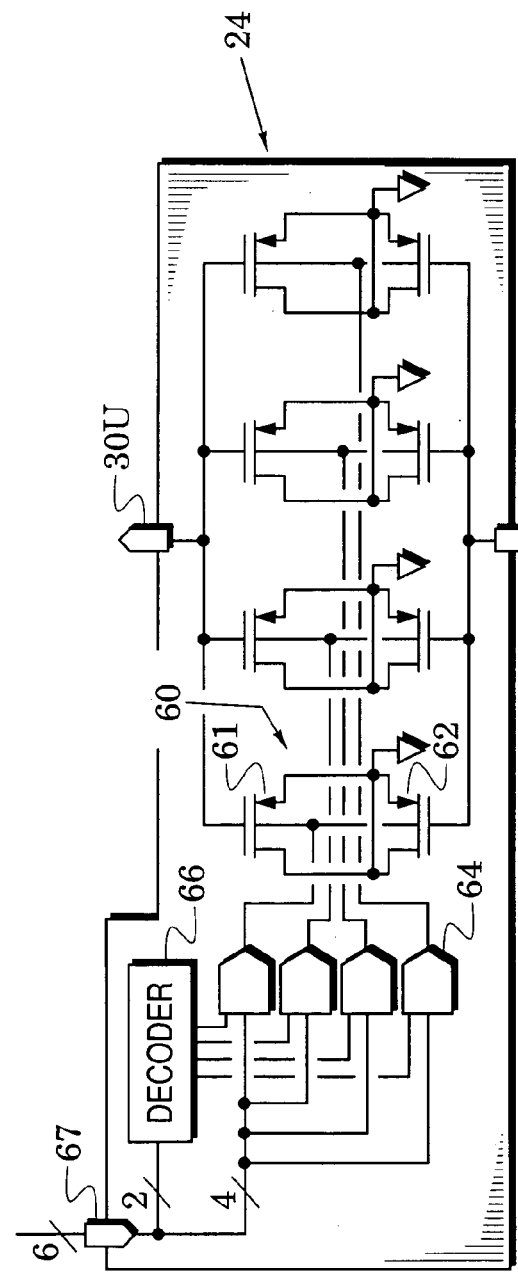

An embodiment of the fine varactor 24 is provided in FIG. 3A which shows sets 60 of first and second transistors 61 and 62 that each have a gate, a back gate, a source and a drain. All sources and drains of each set 60 are coupled to an oscillator potential (e.g., a ground potential), the gates are coupled across the amplifier input terminals (30U and 30L in FIG. 3A) to provide a capacitance, and the back gates are coupled together to receive a tuning potential that determines that capacitance.

In operation of a set 60, a tuning potential on the coupled back gates of the transistors 61 and 62 alters the transistors' source-to-gate capacitance and drain-to-gate capacitance so that the set provides a transfer function of output capacitance versus input tuning potential. The arrangement of the set provides a balanced structure so that, in response to oscillation signals across the terminals 30U and 30L, the capacitances of both transistors vary equally in response to the tuning potential.

Accordingly, the junctions of the coupled sources and coupled drains are signal nulls which may be coupled to a fixed oscillator potential without substantially affecting the oscillator signals. It has been found that the potential chosen will affect the set's transfer function (output capacitance as a function of input tuning potential) and that a ground potential is particularly effective in enhancing the transfer function's monotonicity. In addition, it has been found that the balanced varactor arrangement provides an unusually high sensitivity (i.e., a high $C_{max}$ to $C_{min}$ ratio wherein $C_{max}$ and $C_{min}$ in are respectively the greatest and least capacitances produced by the tuning potential). In a P-type metal-oxide-semiconductor (PMOS) embodiment, for example, the set 60 has been found to provide a capacitance ratio on the order of 1.4:1 in response to a tuning potential variation of 0.2–2.3 volts.

Because of the balanced structure of the set 60, the junction between the back gates is also the site of a signal null so that it can be directly coupled to receive a tuning potential as shown in FIG. 3A. Alternatively, the back gates can be coupled to the tuning potential through a resistor to further enhance signal isolation. For example, a set 60A of FIG. 3B couples both back gates through a common resistor 68 to a common tuning potential, a set 60B couples each back gate through a respective resistor 68 to a common tuning potential, and a set 60C couples each back gate through a respective resistor 68 to a respective (and possibly different) tuning potential.

Although the transistors 61 and 62 are shown as P channel devices in FIG. 3A, other embodiments of the set 60 may be effectively formed with N channel devices. In addition, different embodiments of the back gates of the set 60 have been found useful. For example, the back gates may be formed in a common substrate well or, alternatively, formed in respective wells that are coupled by an integrated circuit metal structure.

The capacitive range of the fine varactor 24 is enhanced by combining a plurality of the sets 60 in parallel. The fine varactor 24 of FIG. 3A, for example, is shown to have four parallel sets. This varactor also includes a decoder 66 and four digital-to-analog converters (DACs) 64 which are each coupled between the decoder and a respective one of the sets 60. Two of the 6 bits from the controller (38 in FIG. 1) are used by the decoder to successively enable and control the DACs and the remaining four bits are converted in the DACs to analog potentials that are applied to the back gates of the sets 60.

With this arrangement, the decoder 66 can first enable the upper DAC of FIG. 3A which can then apply 16 different potential levels to the back gates of the leftmost set 60 (in response to the four DAC bits). Locking this DAC to thereby fix its set in its maximum capacitance state, the decoder 38 can now enable the next DAC in line so that this DAC can then apply 16 different potential levels to the back gates of the next set 60.

Continuing in this manner, the decoder and associated DACs cause the capacitance between the terminals 30U and 30L to assume 64 discrete values as it ramps from a maximum capacitance to a minimum capacitance. The decoder 66, therefore, receives its control bits and, in response, properly disables, enables and locks each of the DACs 64 in a successive manner. The decoder control structure to each DAC thus includes sufficient information (e.g., 2 bits) to control these processes.

Figure 4B:
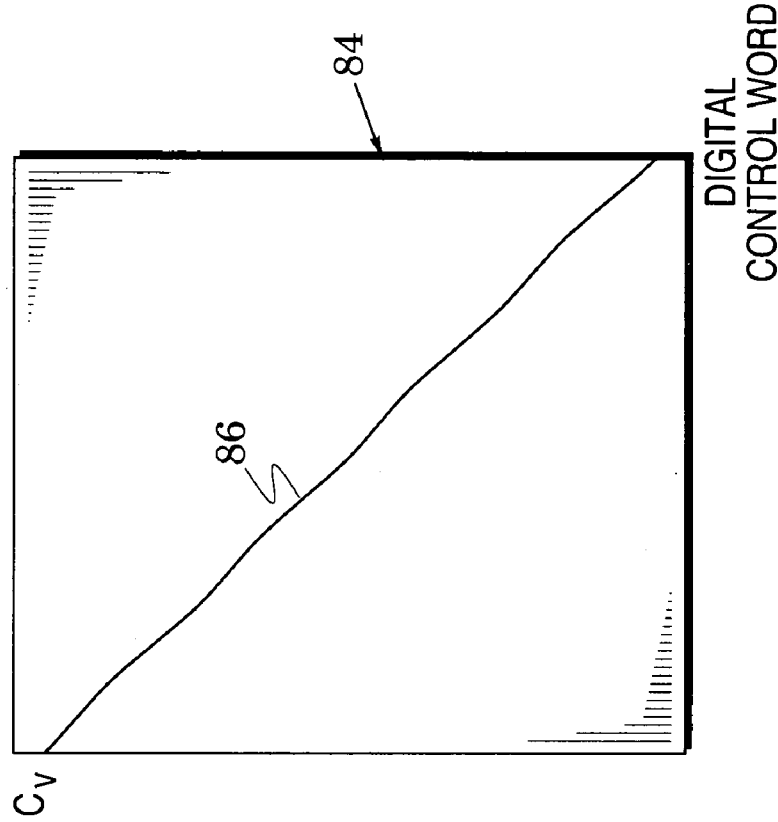
FIG. 4B is a graph of a corresponding transfer function of the fine varactor.
Figure 4A:
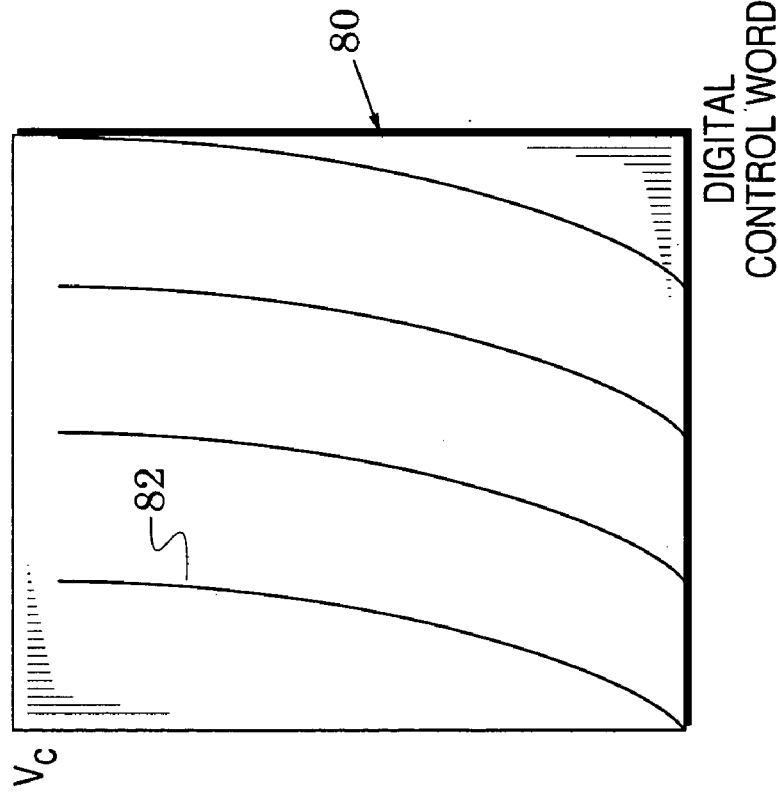
FIG. 4A is a graph of a transfer function of a digital-to-analog converter in the fine varactor of FIG. 3A

In an important feature of the invention, the transfer function of the DACs 64 is altered to enhance the linearity of the transfer function of the fine varactor 24. FIGS. 4A and 4B show exemplary DAC transfer functions and a resulting varactor transfer function. In the graph 80 of FIG. 4A, each transfer function plot 82 corresponds to a respective one of the DACs 64 of FIG. 3A and shows control voltage ($V_c$) generated by the DAC as a function of the digital control word applied to the DAC.

For example, the leftmost plot 82 indicates the transfer function of the uppermost DAC 64 in FIG. 3A. This plot has a shape (e.g., approximately proportional to the square of the control word's magnitude) that enhances the linearity of the transfer function of the varactor set (60 in FIG. 3A) that corresponds to this DAC. Others of the plots 82 have a similar shape and each correspond to a respective one of the other varactor sets.

The graph 84 of FIG. 4B illustrates a plot 86 of the resulting transfer function of the fine varactor (24 in FIG. 3A). The plot shows that the varactor capacitance ($C_v$) is substantially linear with respect to the digital control word from the controller (38 in FIG. 1). A slight nonlinear periodicity has been exaggerated to show the intersections between the portions of the transfer functions contributed by each of the sets 60 of transistors 61 and 62 of FIG. 3A.

It is intended that the fine varactor (24 in FIG. 1) provides a fine tuning range that spans the range between each tuning step of the coarse varactor (26 in FIG. 1). That is, each coarse tuning step should substantially match the tuning range of the fine varactor. This is realized in the coarse varactor embodiment of FIG. 5 with varactor groups 100 that are each formed with four of the sets 60 as was done in the fine varactor 24 of FIG. 3A. In contrast, however, the back gates of all of the sets of each group 100 are coupled together and coupled to receive a common tuning potential from a decoder 102.

The decoder 102 that receives the 7-bit signal from the controller (38 in FIG. 1) is preferably a thermometer decoder. As the controller word increases, the decoder initially steps a tuning potential of a first group from a maximum to a minimum value to thereby alter the group's capacitance from a minimum to a maximum value. In response to a further increase in the controller word, the decoder steps a tuning potential of a next group from a maximum to a minimum value to thereby alter this group's capacitance from a minimum to a maximum value. At this point, the capacitance of two groups has been altered from their minimum to their maximum capacitance and the capacitance of the remaining groups remain at their minimum values.

Figure 5:
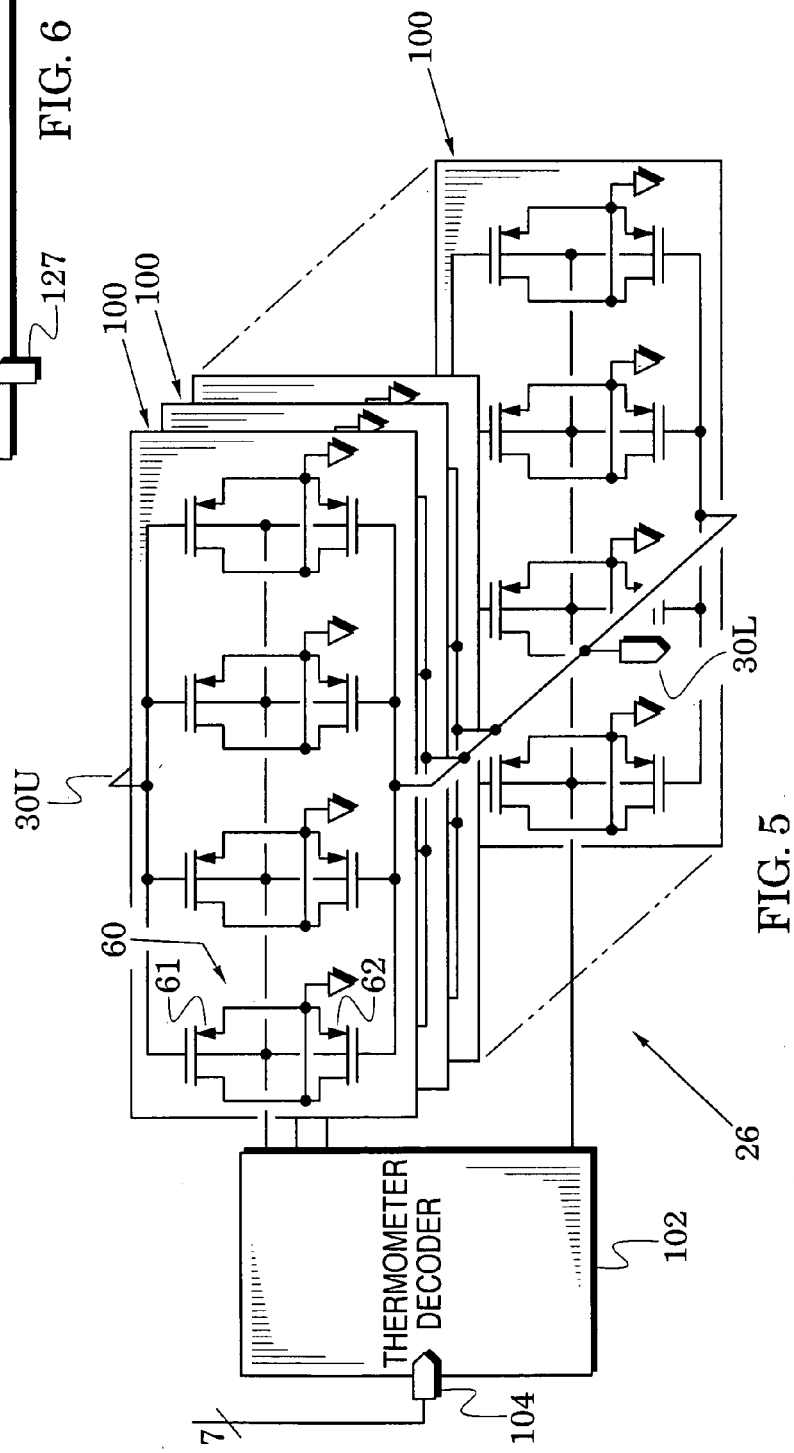
FIG. 5 is a schematic of a coarse varactor in the oscillator of FIG. 1.

In an exemplary embodiment, the coarse varactor 26 of FIG. 5 includes 127 of the groups 100 coupled between amplifier input terminals 30U and 30L. Each group has a difference of approximately 69 femtofarads (fF) between its minimum and maximum capacitance. Accordingly, thermometer decoder 102 can progressively alter the capacitance across the amplifier input port (30 in FIG. 1) over a range on the order of 127×69=8.76 picofarads (pF). In this embodiment, the fine varactor 24 of FIG. 3A would then provide 64 capacitance steps that would, together, span the 69 fF between any selected pair of the groups 100 of FIG. 5 (resulting in 8192 steps of approximately 1.06 fF each over a range of 8.83 pF).

In a different embodiment, the groups 100 may be configured to provide coarse capacitance steps that are binarily related. This embodiment would significantly reduce the number of groups 100 and would be compatible with a binary decoder that would replace the thermometer decoder 102. Many of the applications for the oscillator 20 of FIG.1 envision its use in a control loop where it is important that the oscillator's transfer function be monotonic and reasonably linear. If errors in the binarily-related capacitance values of this different embodiment are sufficient, it is possible to have a capacitance decrease for some values of the input control word at the coarse varactor's input terminal 104.

Because the thermometer decoder 102 adds or subtracts groups 100 that all have (essentially) the same capacitance, the coarse varactor embodiment of FIG. 5 is necessarily monotonic and its transfer function (output capacitance versus input control word) is substantially linear.

Together, the fine and coarse varactors of FIGS. 3A and 5 provide a monotonic and substantially linear capacitance variation across the input port 30 of the amplifier 22 of FIG. 1 in response to control words from the controller 38. In some uses of the oscillator 20 of FIG. 1, it is also helpful to have a calibration adjustment of the oscillator that insures that the tuning range of the fine and coarse varactors is substantially centered on the desired oscillator frequency.

Figure 6:
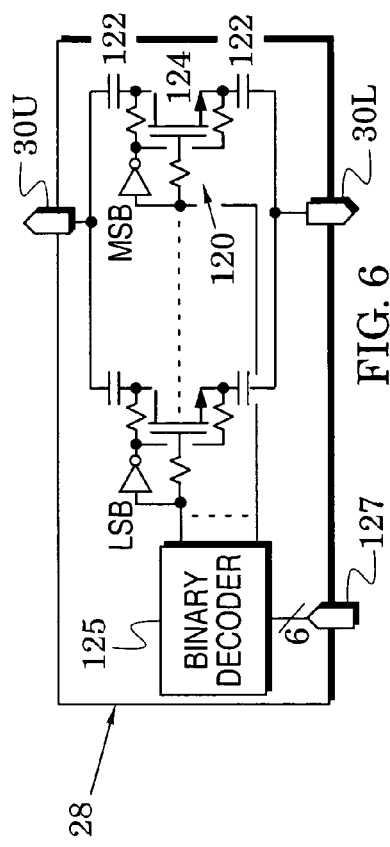
FIG. 6 is a schematic of a selectable capacitor array in the oscillator of FIG. 1.

Accordingly, FIG. 6 illustrates an array 28 of selectable capacitors. In particular, the array includes an array of capacitors 122 and an array of transistors 124 that are each positioned between a pair of the capacitors to form calibrate units 120. The transistors (shown with corresponding bias resistors and inverter) respond to a binary decoder 125 which receives a 6-bit calibrate signal from a port 127. The pairs of capacitors are preferably configured to have binarily-related capacitances so that the capacitance of the calibrate units 120 range from a least significant bit (LSB) unit to a most significant bit (MSB) unit.

In operation, the 6-bit control word can selectively turn on the transistors 124 in the calibrate units 120 to thereby realize 64 capacitance steps which are separated by the capacitance of the LSB unit. In an embodiment of the capacitor array, the capacitors 122 are sized to provide an LSB capacitance on the order of 200 fF. These step sizes are relatively large so that capacitance errors can be sufficiently controlled to maintain monotonicity in the capacitor array's transfer function. An exemplary component of this control sizes the transistors 124 so that their capacitances in their "off" states follow a binary relationship and, accordingly, help to insure the array monotonicity.

In operation of the reference oscillator 20 of FIG. 1, the cross coupling of the amplifier 22 generates a negative impedance at the input port 30. In particular, it is believed that it generates a negative resistance which cancels positive resistance (e.g., in the form of losses of the crystal 23 and parasitics of the fine and coarse varactors 24 and 26 and the capacitor array 28) at this port to thereby maintain the oscillation condition. It is further believed that reactive elements of the crystal (e.g., serially-coupled inductor and capacitor) resonate in a series mode and the capacitance of the fine and coarse varactors 24 and 26 and the capacitor array 28 pulls this resonant mode over a restricted bandwidth.

Initially, the 6-bit calibrate signal of the capacitor array 28 is used to remove any basic frequency error of the oscillator. Preferably, the controller 38 initially places the coarse and fine varactors 24 and 26 approximately in the middle of their adjustment ranges (e.g., by applying a code of 4608 which is near the middle of the 13-bit range (7-bit coarse range and 6-bit fine range). The 6-bit calibrate signal is then selected to place the frequency of the output signal (at the oscillator's output port 34) at or near the desired reference frequency (e.g., 26 MHz). The capacitors (122 in FIG. 6) are sized so that the LSB of the capacitor array of FIG. 6 is appropriate and sufficient (e.g., 200 fF) for this initial alignment of the reference oscillator.

Once the capacitor array 28 has been adjusted to remove the initial frequency error, the controller 38 is used to adjust the frequency via its 7-bit and 6-bit control signals to the fine and coarse varactors 24 and 26. Extensive testing of the reference oscillator structure has shown that the controller can then maintain the desired reference frequency by means of its control of the coarse and fine varactors. In particular, the testing considered various frequency-disturbing parameters (such as tail current variations in the amplifier (22 in FIG. 1), variations of crystals (23 in FIG. 1) from different manufacturers and temperature-induced variations of crystal frequency) and verified that the coarse and fine varactors provide sufficient tuning range to offset these variations.

It was noted above that the coarse and fine varactors (22 and 23 in FIG. 1) provide a combined transfer function of capacitance versus tuning potential (or control word) that is substantially linear. Because this tuning capacitance is a relatively small portion of the total capacitance across the amplifier input port (30 in FIG. 1), the oscillator's transfer function of frequency versus tuning potential is also substantially linear. Although different embodiments of the coarse and fine varactors can be structured to provide substantially constant frequency steps rather than substantially constant capacitance steps, these embodiments require considerably more complex structures.

Although the reference oscillator 20 of FIG. 1 has been described above to have the crystal 23 coupled across the amplifier input port 30, it is noted that other reactive components can be substituted to form different oscillators. FIG. 1 shows that an inductor 130, for example, can be substituted for the crystal 23 as indicated by substitution arrow 132 (in another example, a serially-coupled inductor and capacitor may be used). Accordingly, the reference oscillator can now be tuned over a greater frequency band but its phase noise will be degraded.

Although the amplifier 22 of FIG. 1 has been shown in an embodiment (FIG. 2) to comprise a cross-coupled differential amplifier, various other amplifier structures (e.g., capacitive divider feedback structures of Pierce, Colpitts and Clapp oscillators) that employ feedback to realize negative-impedance can be used in other embodiments of the invention.

Figure 7:
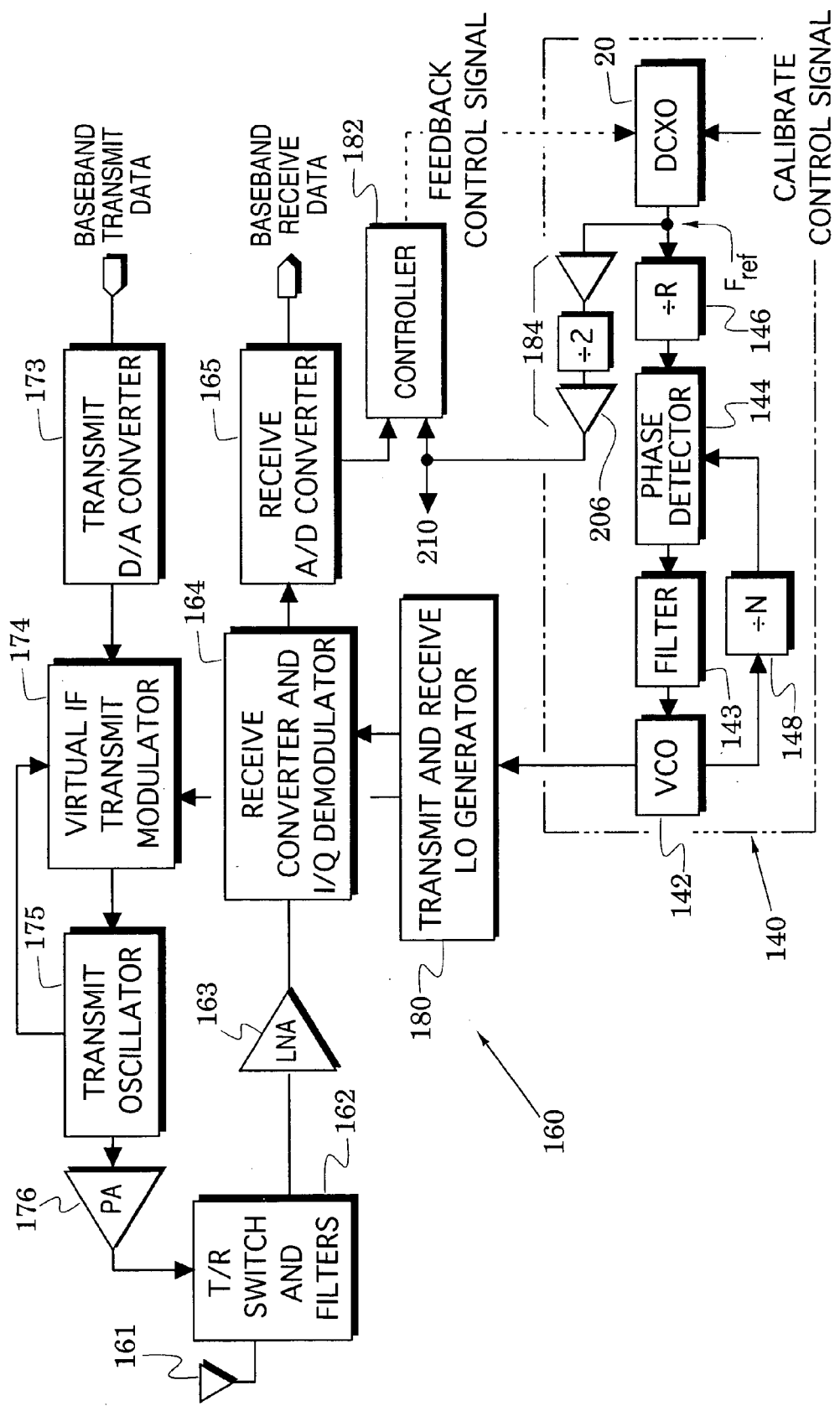
FIG. 7 is a block diagram of a wireless radio that includes the oscillator of FIG. 1.

The reference oscillator illustrated in FIGS. 1–6 is particularly suited for use in the synthesizer 140 of FIG. 7. In addition to the reference oscillator 20 (labeled as a digitally-controlled crystal oscillator (DCXO, the synthesizer includes a voltage-controlled oscillator (VCO) 142, a filter 143, a phase detector 144 and frequency dividers 146 and 148.

In operation, the DCXO provides a reference signal with a reference frequency $F_{ref}$. The frequency divider 146 divides this reference signal by a factor R and couples this divided signal to the phase detector. The frequency divider 148 divides by a factor N and couples a feedback signal from the VCO to the phase detector. In response to these signals from the frequency dividers, the phase detector provides a control signal to low-pass filtering of the filter 143 to the VCO.

Accordingly, the action of the feedback loop causes the synthesized frequency from the VCO to be $(N/R)F_{ref}$. Thus, the synthesizer 140 can provide a signal whose frequency is rapidly altered by appropriate selections of N and R and whose stability and phase noise is enhanced by the excellent stability and phase noise of the DCXO.

As shown in FIG. 7, an exemplary application of the synthesizer 140 is to provide a synthesized signal to a direct downconversion radio 160. The radio includes an antenna 161 and a transmit/receive switch and filters 162. Coupled in series from the T/R switch and filters are a low-noise amplifier (LNA) 163, a receive converter and I/Q demodulator 164 and a receive analog-to-digital converter (ADC) 165. Coupled in series to the T/R switch and filters 162 are a transmit DAC 173, a virtual IF transmit modulator 174, a transmit oscillator 175 and a power amplifier (PA) 176.

A transmit and receive local oscillator (LO) generator 180 typically includes at least one frequency divider and provides different LO signals to the receive converter and I/Q demodulator 164 and the virtual IF transmit modulator 174 that are referenced to the synthesized signal of the synthesizer 140. With its LO signal, the receive converter and I/Q demodulator 165 downconverts (and demodulates) signals received from the antenna 161 to an intermediate frequency or to baseband at which point they are directly converted by the receive ADC 165 to baseband receive data.

Baseband transmit data is converted to analog signals in the transmit DAC 173 and these signals are provided to the virtual IF transmit modulator 174. Signals from the transmit oscillator 175 drive the PA 176 and are also fed back to the virtual IF transmit modulator 174 to form a phase-lock loop that offsets the transmit frequency from the receive frequency and modulates it with the analog signals from the transmit DAC 173.

Because the reference oscillator 20 of FIGS. 1–6 is structured for realization with components (e.g., MOS transistors, resistors and capacitors) that are compatible with fabrication processes of integrated circuits, all of its structures (except the crystal 23 of FIG. 1) can be restricted to a small portion of an integrated-circuit package (chip). This feature facilitates incorporation of major portions of the radio 160 into a single chip.

A tone is typically included in the signals that are received from the antenna 161 of FIG. 7 and a controller 182 receives a sample of this tone, e.g., from the receive ADC 165. Through a serially-connected combination 184 of a buffer amplifier, a frequency divider and an output amplifier, the controller also receives a sample of the reference signal of the DCXO 20 and it compares these signals and provides a feedback control signal that causes the frequency of the DCXO to be in accordance with the received tone. The frequency divider can be selectively bypassed to permit selective comparison of the reference with different frequency tones (e.g., tones of 13 MHz and 26 MHz).

In particular, the controller 182 basically performs the functions of the controller 38 of FIG. 1 and the feedback control signal corresponds to the 7-bit and 6-bit control signals generated by that controller. The frequency of the DCXO 20 of FIG. 7 can be initially calibrated by its calibrate control signal which corresponds to the calibrate signal of FIG. 1 that is applied to the capacitor array 28.

The radio 160 of FIG. 7 may have reception gaps during which the feedback control signal is not available. Although the frequency of the DCXO may drift somewhat during this absence (due, for example, to temperature changes), the coarse and fine varactors 26 and 24 of FIG. 1 are structured (as described above) to have sufficient range to pull the DCXO back to correspond to the tone upon termination of the reception gap.

The monotonicity and linearity of the coarse and fine varactors (26 and 24 in FIG. 1) has been discussed above. The structures of these varactors also facilitate fabrication control processes that realize reference oscillators with exceptionally low differential non-linearity (step to step variation from the expected value) and integral non-linearity (total deviation from the expected value) as they are tuned across their frequency range. This is an important parameter when the reference oscillators are embedded in a feedback loop or used in a direct downconversion radio as in FIG. 7. In addition, it has been found that these structures facilitate the realization of low phase noise (e.g., −153 dBc/Hz at 100 KHz offset).

FIGS. 1–7 having been described above, attention is now directed to FIGS. 8–10B which show embodiments of reference signal generators of the invention. In particular, the reference signal generator 200 of FIG. 8 includes the DCXO 20 of FIG. 7, the frequency controller 38 of FIG. 1, a buffer amplifier 202 and an amplitude controller 204.

Although the buffer amplifier 202 may be, for example, the output amplifier 206 of FIG. 7, it is more generally any buffer inserted between the DCXO and various system elements (210 in FIG. 7) that require the buffer's reference signal. These system elements typically include integrated circuits (e.g., an applications processor, a polyphonic ring tone generator and other circuits that conform to wireless network standards (e.g., Bluetooth and Wi-Fi)) that present an input impedance which is primarily formed by their parasitic capacitances. This capacitive load will vary depending on the particular mix of circuits that require the reference signal.

Figure 8:
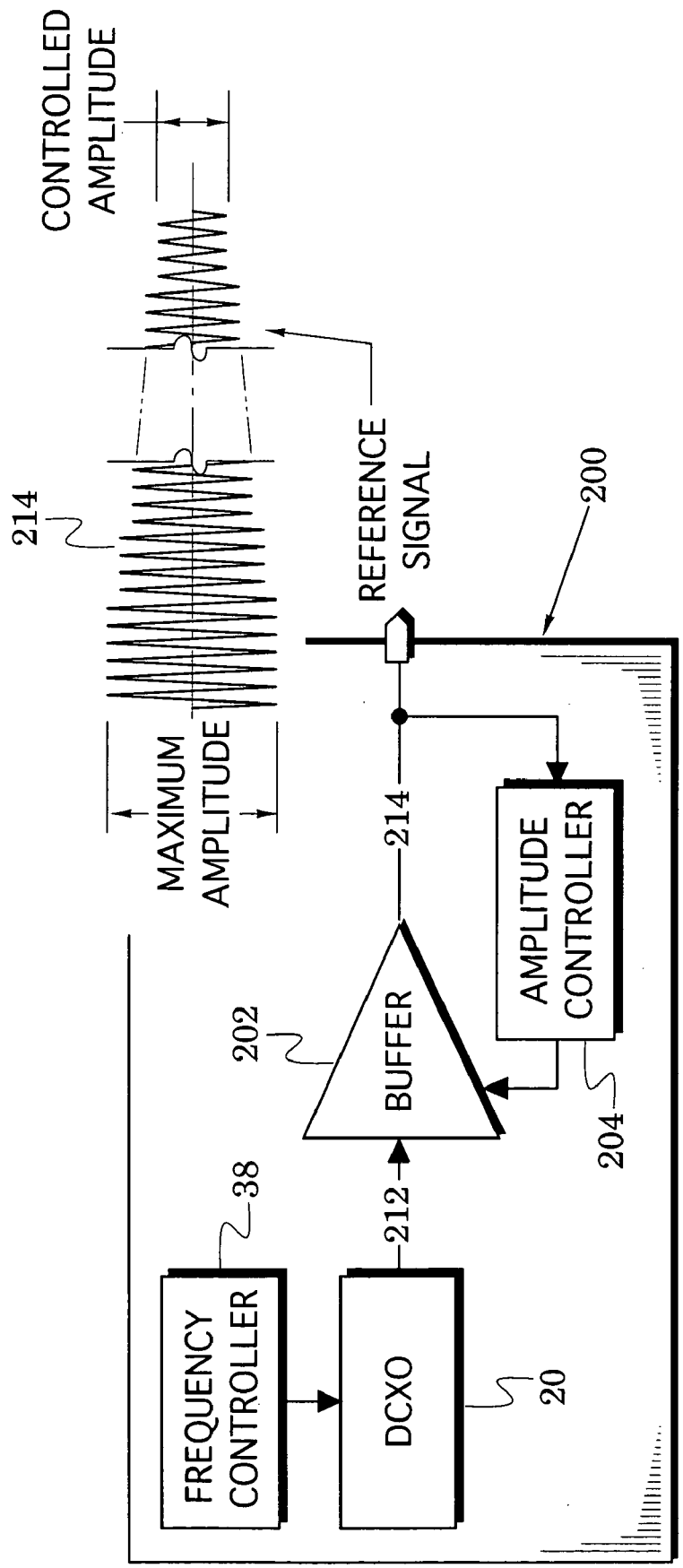
FIG. 8 is a block diagram of a reference signal generator in the radio of FIG. 7.

In operation, the DCXO provides an oscillator signal 212 to the buffer amplifier which has an adjustable amplifier gain and is coupled to process the oscillator signal into a reference signal 214 which has a reference amplitude. As shown in FIG. 8, the amplitude controller 204 is preferably configured to initiate the reference signal at a maximum amplitude and subsequently reduce it to a final controlled amplitude. In one embodiment, the amplitude controller is configured to reduce the amplifier gain of the buffer amplifier until the amplitude of the reference signal 214 corresponds to a predetermined threshold amplitude. The amplifier gain is therefore often less than one.

Figure 9:
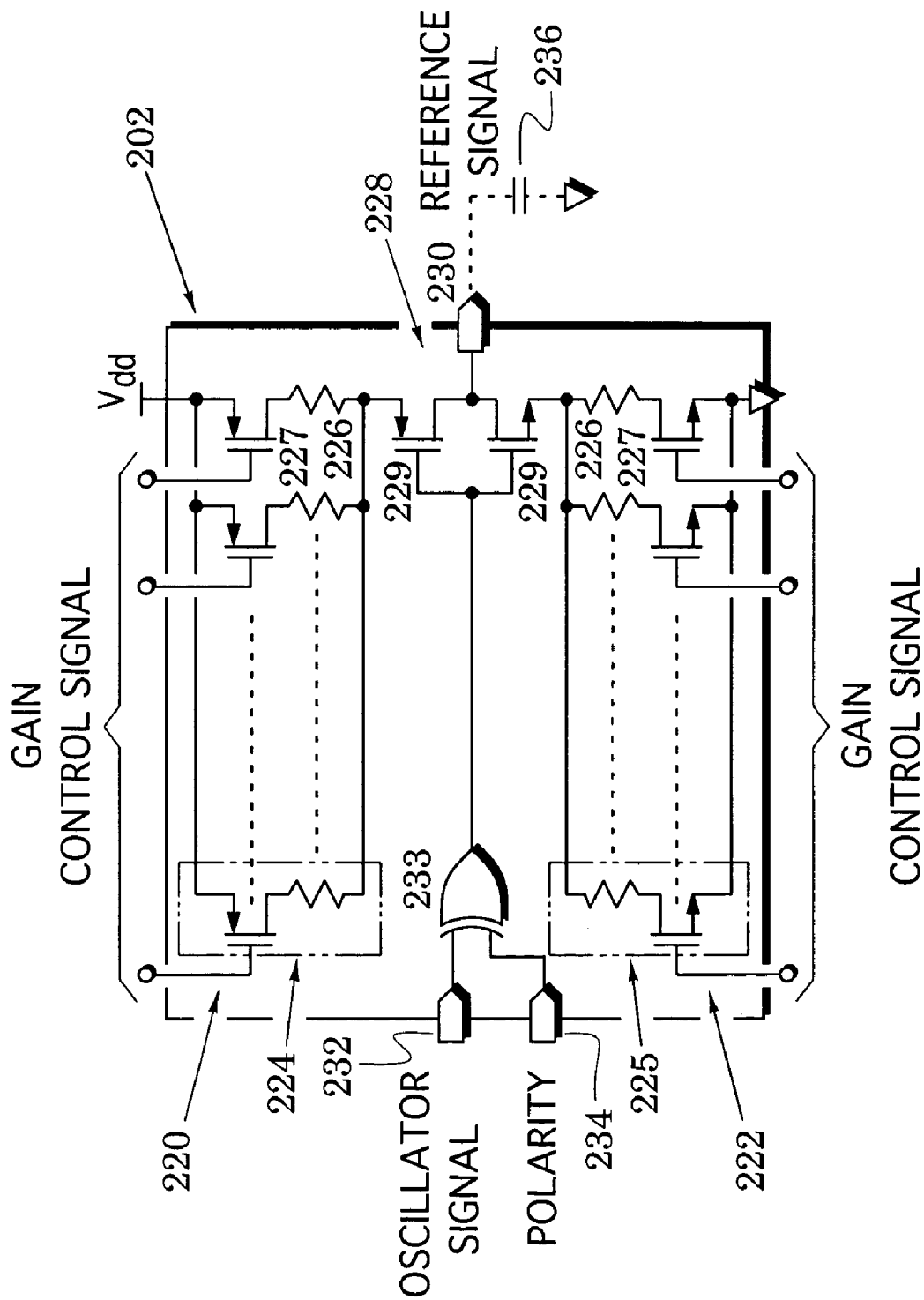
FIG. 9 is a schematic of a buffer amplifier embodiment in the reference signal generator of FIG. 8.

FIG. 9 illustrates an embodiment of the buffer amplifier (202 in FIG. 8) that includes upper and lower sets 220 and 222 of current generators with, specifically, current sources 224 in set 220 and current sinks 225 in set 222. Although various current generators (e.g., current mirrors) can be used in embodiments of the buffer amplifier, an embodiment shown in FIG. 9 has each of the current generators comprising a resistor 226 and a transistor 227 which are serially connected wherein the polarity of the transistors differs appropriately (PMOS and NMOS transistors are used respectively in the current sources and current sinks).

In this embodiment, the transistors essentially operate as access switches to selectively access the resistors (i.e., short them across their respective set) in response to a gain control signal. In another embodiment, the resistors 226 can be replaced by switching transistors which act to block or pass current from their corresponding ones of the transistors 227 and, in yet another embodiment, the transistors can be used alone with their current corresponding to the gain control signal.

The sets 220 and 222 are joined by an inverter in the form of an output stage 228 (e.g., a common-drain output stage) of transistors 229 that couples the selected resistors of the upper and lower sets 220 and 222 to the amplifier's reference port 230 in response to the oscillator signal at an input port 232.

In an exemplary buffer embodiment, there are N resistors 226 in each of the sets 220 and 222 with binarily-related resistances (starting from a minimum resistance R) and the gain control signal is a binary signal so that the resistance of each set has $2^N$ selectable settings with a resolution of R ohms. The oscillator signal may be provided through a gate (e.g., an exclusive OR gate) 233 so that a polarity signal to this gate from a second input port 234 can reverse the polarity of the reference signal. This feature has been found useful because of differing requirements of the system elements that use the reference signal.

As mentioned at the beginning of the description of FIGS. 8–10B, it is often desirable to provide the reference signal to various (and generally unknown) capacitances which are represented in FIG. 9 as the load capacitance 236 that is coupled to the reference port 230. In response to the oscillator signal at the input port 232, currents pass through the resistors 226 to charge the load capacitance 236. The signal amplitude at the output port 230 will thus increase as the load capacitance decreases. Because the signal swing at the reference port is a function of the unknown load capacitance, it is reduced into a desired window by selecting the charging resistances 226 with the gain control signal.

Figure 10A:
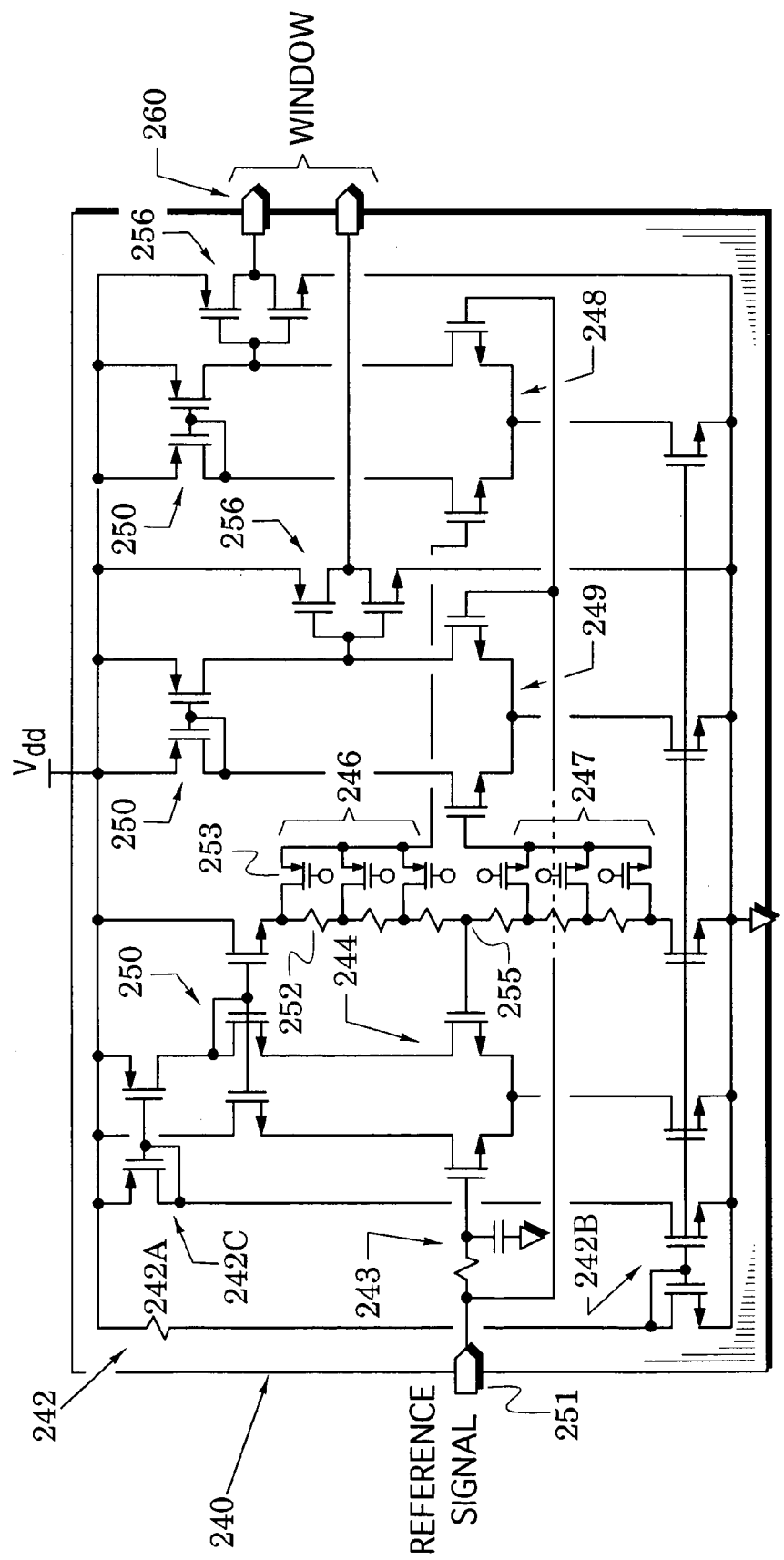
FIGS. 10A and 10B are schematics of an amplitude controller embodiment in the reference signal generator of FIG. 8.
Figure 10B:
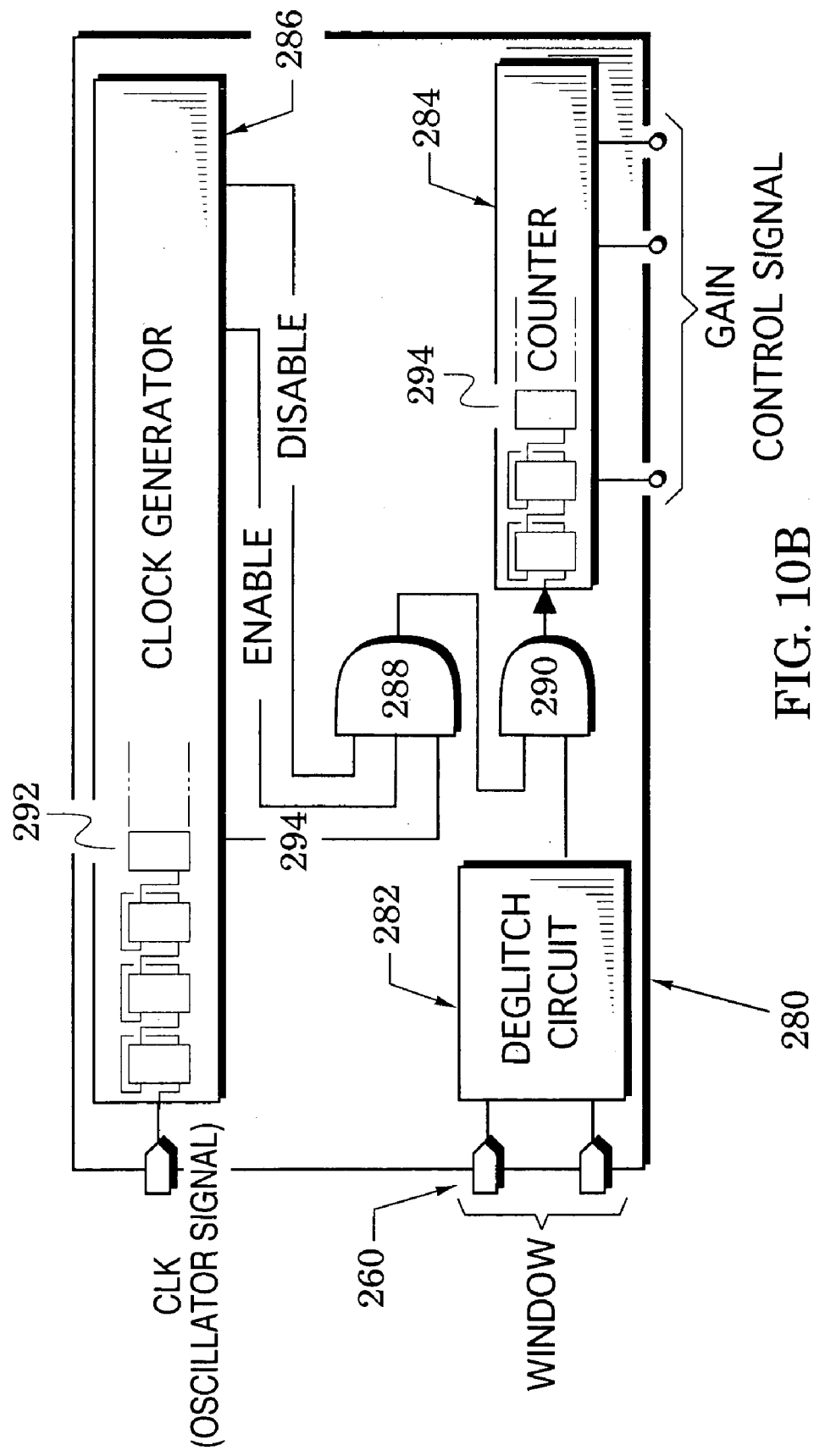

The gain control signal is provided by the amplitude controller 204 in FIG. 8 and a controller embodiment is shown in the automatic level control (ALC) 240 and the ALC logic 280 of FIGS. 10A and 10B. The ALC includes a bias network 242, a low-pass filter 243, an input differential pair 244 of transistors, upper and lower threshold selectors 246 and 247, and upper and lower comparators 248 and 249. The comparators each comprise a differential pair of transistors.

The bias network 242 includes a resistor 242A that establishes a current into a lower set of current mirrors 242B which also establish currents in an upper set of current mirrors 242C. The bias network 242 is arranged and coupled to establish a controlled current in the threshold selectors 246 and 247 and controlled tail currents in the input differential pair 244 and the upper and lower comparators 248 and 249. Active loads 250 are provided to the input differential pair 244 and the differential pairs of the upper and lower comparators 248 and 249.

The low-pass filter 243 couples an input port 251 to a first gate of the input differential pair. The upper and lower threshold selectors 246 and 247 are respectively coupled between the input differential pair 244 and the upper and lower comparators 248 and 249. The upper and lower threshold selectors 246 and 247 each include serially-connected strings of resistors 252 that are coupled to a junction 255 between the strings and this junction is coupled to a second gate of the input differential pair 244. The upper and lower threshold selectors also include tap transistors 253 arranged to provide access to respective tap points in the resistor strings.

In operation, of this portion of the ALC 240, the reference signal is received at the input port 251 and the common-mode level of the reference signal (established in the buffer amplifier 202 of FIG. 9) is coupled to the first gate of the differential pair 244 via the low-pass filter 243 which substantially removes the time varying portion of the reference signal. An embodiment of the low-pass filter 243 is shown in FIG. 10A to comprise a series resistor followed by a shunt capacitor which provides the common-mode level to the first gate of the differential pair 244. The input differential pair 244 steers its tail current through its active load 250 and this operation transfers the common-mode level from the first gate to the second gate of the input differential pair and thereby, to the junction 255 between the upper and lower threshold selectors 246 and 247.

Selection of tap transistors 253 in the upper and lower threshold selectors 246 and 247 (by appropriate selection signals at the tap transistor gates which are indicated by open circles) applies selected upper and lower threshold voltages at first gates of the upper and lower comparators 248 and 249. The upper and lower comparators thus compare these upper and lower threshold voltages to the reference signal which is coupled from the input port 251 to second gates of the upper and lower comparators. The comparator decisions are coupled from output drains of the upper and lower comparators through output inverters 256 to an output port 260 which thus provides a window signal.

In operation of the buffer amplifier (202 in FIG. 9) and the ALC 240, currents flow through the selected resistors 226 in FIG. 9 to charge the load capacitor 236 and the currents reverse each time the transistors 229 of the output stage 228 respond to the oscillator signal. The signal at the input port 251 of the ALC 240 is thus a triangle or exponential waveform similar to that shown in FIG. 8. The initial reference amplitude of this reference waveform exceeds the selected upper and lower threshold signals at the first gates of the upper and lower comparators 248 and 249 and, therefore, a first train of pulses appears at the upper side of the output port 260 and a second train of pulses appears at the lower side wherein the first and second trains are substantially 180 degrees out of phase with each other.

As the gain control signal at the buffer amplifier 220 of FIG. 9 is appropriately altered, the combined resistance of the charging resistors 226 increases so that the reference amplitude decreases and the width of the pulses in the first and second trains narrows and ultimately reaches a point where they disappear. At that point, the amplitude of the reference signal has been reduced to that amplitude determined by the selected tap transistors 253 in the first and second threshold selectors 246 and 247 of FIG. 10A.

This process is realized automatically when the ALC logic 280 of FIG. 10B provides the gain control signal to the buffer amplifier (202 in FIG. 9) in response to the window signal at the output port of the ALC (260 in FIG. 10A). The ALC logic includes a deglitch circuit 282, a counter 284, a clock generator 286, a gate 290 coupled between the deglitch circuit and the counter, and a second gate 288 coupled between the clock generator and the gate 290.

The clock generator receives a clock signal CLK which may be the oscillator signal (212 in FIG. 8) and provides (e.g., with a series 292 of flip-flops) slower clock signals such as the clock signal 294 which may, for example, be CLK/4. Other slower clock signals are an enable signal (e.g., at CLK/32) and a disable signal (e.g., at CLK/128).

Because the enable signal is not initially present, the circuits of the reference signal generator (200 in FIG. 8) are allowed to stabilize. When the enable signal is provided, the clock 294 is passed through the gate 288 to the gate 290. Because of the presence of the window signal, the clock 294 passes through the gate 290 (the deglitch circuit will be subsequently described) and is counted in the counter 284 (e.g., with a series 294 of flip-flops). The counter's gain control signal alters so as to successively increase the combined resistance of the charging resistors 226 in FIG. 10A which causes the reference amplitude of the reference signal to successively decrease.

When it decreases below that amplitude determined by the first and second threshold selectors (246 and 247 in FIG. bA), the pulse trains at the ALC output port (260 in FIG. 10) cease. This output port is the same as the input port 260 in the ALC logic 280 of FIG. 10B. Accordingly, the pulse trains at this port cease which turns off the gate 290 so that the gate 290 blocks the clock 294 and stops the counter 284. The reference amplitude of the reference signal has now been automatically reduced to the amplitude determined by the selected tap transistors 253 in the first and second threshold selectors 246 and 247 of FIG. 10A.

Subsequently, the disable signal from the clock generator 286 closes the gate 288 to insure that the clock signal 294 is not passed to the counter 284. Although the gate 290 has already been closed by the window signal, this provides further assurance that a spurious signal does not pass through to the counter 284 and reduce the reference amplitude of the reference signal past that level determined by the first and second threshold selectors.

Attention is now directed to the deglitch circuit 282 which is configured to keep the gate 290 open as long as the window signal is comprised of the first and second pulse trains from the upper and lower comparators (248 and 249 in FIG. 10A) but prevent false triggering of the counter if a glitch (spurious signal) is coupled to the input port 260 in their absence.

As noted above, these pulse trains are substantially 180 degrees out of phase and four pulses from each train will arrive at the deglitch circuit 282 before the next pulse arrives from the clock signal 294 (assuming the clock signal 294 is CLK/4). The deglitch circuit is configured to recognize the pulse trains (e.g., with pairs of flip-flops coupled to a gate) and appropriately keep the gate 290 open so that the counter 284 continues to alter the gain control signal.

When the first and second pulse trains initially cease, the disable signal has not yet closed the gate 288. If a spurious signal were to be generated and coupled to the input port 260 of the ALC logic 280, it might permit the clock signal 294 to pass through the gate 290 and trigger the counter and the reference amplitude of the reference signal would be decreased below the intended level. This might endanger the integrity of the systems that receive the reference signal.

To insure against this condition, the deglitch circuit is inserted and configured to keep the gate 290 open only if it recognizes the pulse trains. In the absence of these trains, the deglitch circuit closes the gate 290 to prevent inadvertent decrease of the amplitude of the reference signal below its intended level. Subsequently, the disable signal appears and permanently closes gates 288 and 290.

An exemplary result of the operation of the reference signal generator is shown in the reference signal 214 of FIG. 8 wherein it is assumed that the CLK at the clock generator 286 in FIG. 10B is the oscillator signal and that the clock signal 294 is CLK/4. The reference signal 214 is initially generated at a maximum amplitude and then decreases after each subsequent four cycles as the counter 284 in FIG. 10B responds to the clock signal 294. When the window signal at the port 260 in FIGS. 10A and 10B ceases (the pulse trains disappear), this decrease is terminated and the reference signal remains at a controlled amplitude.

The reference signal generator thus automatically adjusts its reference signal's amplitude when that signal is delivered into system loads having various (and generally unknown) capacitances. The amplitude is preferably initiated at a maximum amplitude to insure operation of the system elements that require the reference signal. It is subsequently adjusted downward to the controlled amplitude which is predetermined to be an amplitude sufficient to sustain proper operation of the system elements but sufficiently reduced to minimize the spurious signals typically generated by fast high-level current transitions. In addition, the reduction to the controlled amplitude reduces the system current drain. Because the level control is accomplished in the buffer amplifier (202 in FIG. 8), the amplitude level of the oscillator signal from the DCXO (20 in FIGS. 7 and 8) can be set independently to maximize its signal-to-noise performance, i.e., requirements for the reference amplitude do not compromise requirements for the amplitude level of the oscillator signal.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A reference signal generator, comprising:
an oscillator that provides an oscillator signal;
a buffer amplifier having an adjustable amplifier gain and coupled to process said oscillator signal into a reference signal that has a reference amplitude; and
a controller that adjusts said amplifier gain in response to said reference amplitude;
wherein said amplifier gain corresponds to a gain control signal and said controller includes:
at least one comparator that responds to said reference signal and provides a pulse train when said reference amplitude exceeds a predetermined threshold signal; and
in response to said pulse train, a counter that provides said gain control signal to thereby reduce said amplifier gain until said reference amplitude no longer exceeds said threshold signal;
and wherein said controller further includes:
a generator that responds to a first clock signal to provide a second clock signal, an enable signal and a subsequent disable signal;
a first gate that passes said second clock signal in response to said enable signal and blocks said second clock signal in response to said disable signal; and
a second gate that passes said second clock signal from said first gate to said counter in response to said pulse train.

2. The generator of claim 1, wherein said comparator is a differential pair of transistors.

3. The generator of claim 1, wherein said buffer amplifier includes:
at least one set of current generators that provide a current with a current amplitude that corresponds to said gain control signal; and
an inverter that carries said current to provide said reference signal with said reference amplitude thereby corresponding to said gain control signal.

4. The generator of claim 3, wherein said current generators are configured with binarily-related currents so that said current amplitude has a binary relationship to said gain control signal.

5. A reference signal generator, comprising:
an oscillator that provides an oscillator signal;
a buffer amplifier having an adjustable amplifier gain and coupled to process said oscillator signal into a reference signal that has a reference amplitude; and
a controller that adjusts said amplifier gain in response to said reference amplitude;
wherein said amplifier gain corresponds to a gain control signal and said controller includes:
at least one comparator that responds to said reference signal and provides a pulse train when said reference amplitude exceeds a predetermined threshold signal; and
in response to said pulse train, a counter that provides said gain control signal to thereby reduce said amplifier gain until said reference amplitude no longer exceeds said threshold signal;
and wherein said at least one comparator comprises upper and lower comparators that respectively respond to upper and lower predetermined threshold signals.

6. The generator of claim 5, wherein said buffer amplifier includes:
a plurality of resistors; and
a plurality of switches that selectively access said resistors in response to said controller to thereby adjust said amplifier gain.

7. The generator of claim 5, wherein said oscillator is a digitally-controlled crystal oscillator.

8. A reference signal generator comprising:
an oscillator that provides an oscillator signal:
a buffer amplifier having an amplifier gain that corresponds to a gain control signal and coupled to process said oscillator signal into a reference signal that has a reference amplitude; and
a controller that adjusts said gain control signal in response to said reference amplitude;
wherein said controller includes:
a counter that counts a clock signal to thereby generate said gain control signal; and
a comparator that provides said clock signal to said counter in response to a comparison of said reference signal and a threshold signal;
wherein said controller further includes:
a string of resistors coupled to provide selectable voltages; and
a plurality of transistors coupled to selectively provide one of said voltages as said threshold signal;
and wherein said controller further includes a differential pair of amplifiers that transfers a common mode level of said reference signal to said string of resistors.

9. The generator of claim 8, wherein said buffer amplifier includes a plurality of current generators that are responsive to said gain control signal.

10. The generator of claim 9, wherein each of said current generators includes:
a plurality of resistors; and
a plurality of switches that selectively access said resistors in response to said gain control signal to thereby adjust said amplifier gain.

11. The generator of claim 9, wherein said buffer amplifier provides said reference signal at a reference port and each of said current generators includes:
a plurality of resistors;
a plurality of access switches that access selected ones of said resistors in response to said controller; and
an output switch that couples selected resistors to said reference port in response to said oscillator signal.

12. The generator of claim 8, wherein said comparator comprises a differential pair of transistors.

13. A reference signal generator comprising:
an oscillator that provides an oscillator signal;
a buffer amplifier having an amplifier gain that corresponds to a gain control signal and coupled to process said oscillator signal into a reference signal that has a reference amplitude; and
a controller that adjusts said gain control signal in response to said reference amplitude;
wherein said controller includes:
a counter that counts a clock signal to thereby generate said gain control signal; and
a comparator that provides said clock signal to said counter in response to a comparison of said reference signal and a threshold signal;
and wherein said controller further includes a gate inserted to pass said clock signal to said counter in response to said comparator.

14. The generator of claim 13, wherein
said comparator generates a pulse train when said reference signal exceeds said threshold signal; and
said gate passes said clock signal in response to said pulse train.

15. The generator of claim 14, wherein said controller further includes a generator that provides an enable signal to enable said gate and a subsequent disable signal to disable said gate.

16. A reference signal generator, comprising:
an oscillator that provides an oscillator signal;
a buffer amplifier having an amplifier gain that corresponds to a gain control signal and coupled to process said oscillator signal into a reference signal that has a reference amplitude; and
a controller that adjusts said gain control signal in response to said reference amplitude;
wherein said controller includes:
a counter that counts a clock signal to thereby generate said gain control signal;
upper and lower comparators that generate pulse trains when said reference signal exceeds predetermined threshold signals; and
a gate that passes said clock signal to said counter in response to said pulse trains.

17. The generator of claim 16, wherein said controller further includes:
a differential pair of amplifiers that provides a common mode level of said reference signal; and
a string of resistors that provides said threshold signals in response to said common mode level.

18. The generator of claim 16, wherein said controller further includes a generator that provides an enable signal to enable said gate and a subsequent disable signal to disable said gate.

19. The generator of claim 16, wherein said oscillator is a digitally-controlled crystal oscillator.

20. A synthesizer, comprising:
a voltage-controlled oscillator;
a phase detector that provides a control signal to said voltage-controlled oscillator;
a first frequency divider coupled between said voltage-controlled oscillator and said phase detector;
a reference oscillator that generates an oscillator signal;
a second frequency divider coupled between said reference oscillator and said phase detector;
a buffer amplifier having an adjustable amplifier gain and coupled to process said oscillator signal into a reference signal that has a reference amplitude; and
a controller that adjusts said amplifier gain in response to said reference amplitude;
wherein said controller includes:
a counter set to an initial count that maximizes said amplifier gain and coupled to provide a subsequent count of a clock signal that reduces said amplifier gain; and
a comparator that terminates said subsequent count when said reference amplitude reaches a threshold amplitude;
and wherein said controller further includes:
a gate coupled to pass said clock signal to said counter; and
a generator that provides an enable signal to enable said gate and a subsequent disable signal to disable said gate.

21. The synthesizer of claim 20, wherein said controller further includes:
a differential pair of transistors that provide a common mode level of said reference signal; and
a resistor string that provides said threshold amplitude in response to said common mode level.

22. The synthesizer of claim 20, wherein said buffer amplifier includes:
a plurality of resistors; and
a plurality of switches that selectively access said resistors in response to said controller to thereby adjust said amplifier gain.

23. A reference signal generator, comprising:
an oscillator that provides an oscillator signal;
a buffer amplifier having an amplifier gain that corresponds to a gain-control signal and arranged to amplify the amplitude of said oscillator signal to thereby provide a reference signal;
a low-pass filter which extracts a common-mode level from said reference signal;
a string of resistors which defines upper and lower tap points and a junction between said upper and lower tap points;
an input differential pair of transistors having an output coupled to drive said string and having a differential input coupled between said filter and said junction to thereby transfer said common-mode level to said junction;
an upper differential pair of transistors that generates a first pulse train in response to its differential input which is coupled between said reference signal and a selected one of said upper tap points;
a lower differential pair that generates a second pulse train in response to its differential input which is coupled between said reference signal and a selected one of said lower tap points; and
a counter that is enabled by said first and second pulse trains to count a clock signal to thereby generate a count which comprises said gain-control signal;
wherein increase of said count decreases said amplifier gain until said first and second pulse trains cease.

24. The generator of claim 23, wherein said buffer amplifier includes:
upper and lower sets of resistors;
an inverter coupled between said upper and lower sets and having an input coupled to receive said oscillator signal from said oscillator and an output which provides said reference signal; and
upper and lower transistor switches respectively arranged to selectively couple resistors of said upper and lower sets to a power supply in response to said gain-control signal.

25. The generator of claim 24, wherein the resistances of the resistors of said sets are binarily related.

26. The generator of claim 23, further including:
a first set of tap transistors that are each inserted between a respective one of said upper tap points and said upper differential pair to selectably provide said selected upper tap point; and
a second set of tap transistors that are each inserted between a respective one of said lower tap points and said lower differential pair to selectably provide said selected lower tap point.

27. The generator of claim 23, further including:
a gate that passes said clock signal to said counter in response to presence of said first and second pulse trains; and
a clock generator arranged to provide said clock signal for a time sufficient to accommodate a decrease of said amplifier gain.

* * * * *